United States Patent

[15] 3,646,578

[45] Feb. 29, 1972

Gregory

[54] GATE DRIVE FOR CONTROLLED RECTIFIERS

[72] Inventor: Elmo M. Gregory, Newport Beach, Calif.

[73] Assignee: Lear Jet Industries, Inc., Wichita, Kans.

[22] Filed: Oct. 21, 1969

[21] Appl. No.: 868,023

[52] U.S. Cl. ..........................307/252 J, 307/247, 307/265, 321/9, 328/157, 331/113 A

[51] Int. Cl. ..........................H03k 17/30

[58] Field of Search............307/252 R, 252 G, 252 J, 252 M, 307/252 N, 252 UA, 252 W, 252 H, 265, 282, 284, 247; 321/2, 2 HF; 323/225 C; 328/32, 34, 138, 139, 140, 150, 157, 171; 331/113 A, 114, 173

[56] References Cited

UNITED STATES PATENTS

| | | | |
|---|---|---|---|
| 2,950,446 | 8/1960 | Humez et al. | 321/2 X |
| 3,169,232 | 2/1965 | Engman et al. | 307/252 H X |
| 3,280,810 | 10/1966 | Worrell et al. | 307/282 X |
| 3,297,936 | 1/1967 | Ruch. | 321/2 X |
| 3,316,482 | 4/1967 | McVey | 307/252 N X |
| 3,334,292 | 8/1967 | King et al. | 307/265 X |
| 3,448,300 | 6/1969 | Gyugyi | 307/252 J X |
| 3,477,010 | 11/1969 | VeNard | 321/9 X |

OTHER PUBLICATIONS

Wyland, " Transformer Isolation Switch," IBM Technical Disclosure, Vol. 11, No. 1, June 1968.
Popular Electronics, p. 68, Oct. 1967.

*Primary Examiner*—John S. Heyman
*Assistant Examiner*—L. N. Anagnos
*Attorney*—Richard A. Marsen

[57] ABSTRACT

An effective gate drive for silicon controlled rectifiers is provided by a relatively low-voltage, low-power electronic circuit, individual to each rectifier. The gate drive circuits hereof utilize a gated high-frequency oscillator, as a modified Royer type. Control logic ON pulses effect their oscillation, providing relatively narrow square wave pulses that are rectified to constitute the pedestal of each drive signal. A second portion of each gate drive signal is also initiated by the logic pulses, each with a rapid rise rate and of ample magnitude. The composite gate drive signal is transformer coupled to the associated SCR gate electrode, providing independence as to circuital grounding. Drive circuit is efficient and low in weight. Applicable in high-power-controlled rectifier systems.

8 Claims, 3 Drawing Figures

INVENTOR.
PHILIP S. DIVITA
EARL N. POWERS
BY CHARLES J. WERNETH
Synnestvedt & Lechner
ATTORNEY

GATE DRIVE FOR CONTROLLED RECTIFIERS

BACKGROUND OF THE INVENTION

A controlled rectifier is rendered conductive when a signal of sufficient magnitude is applied to its gate electrode, positive with respect to its cathode. When properly connected, current thereupon flows through its anode-cathode output or load circuit, as is well known. Silicon controlled rectifiers are in general use, and are available in substantial current and power ratings. For high-power applications it is desirable to apply gate drive signals with rapid initial rise rate, as well as with sufficient peak voltage and power. The duration of such signals is preferably maintained during the requisite firing periods to insure conduction through the rectifier during its prearranged periods of operation in the system.

In accordance with the present invention a composite gate signal pulse is provided, with an initial high-level fast rise component superimposed on a lower level steady component or pedestal of proper duration. The initial pulse component is readily arranged to have a rise time of the order of 200 nanoseconds, as is desirable for power silicon control rectifiers. Such peaked pulse can well be of the order of 10 microseconds long. The net gate drive signal with its pedestal or "back porch" is directly controlled in the invention circuit, and made to correspond in duration with the period of firing of the individual SCR.

An individual gating arrangement is provided for each of the SCR's of the system, which may be a polyphase power supply per U.S. Pat. No. 3,477,010 for "Synthetic Wave Three Phase Alternating Current Power Supply System," assigned to the assignee hereof. The gate drive system hereof provides precise firing times for the controlled rectifiers, avoiding excess power dissipation therein in view of the initial rapid rise time of the gating signals.

SUMMARY OF THE INVENTION

The power controlled rectifiers are individually turned on by an associated gate drive circuit. Each such circuit utilizes a gated oscillator at a frequency substantially higher than that of the power system. A Royer-type oscillator provides square pulses at each half cycle, that in turn are rectified to provide the pedestal for the composite gate drive signal. The duration of each pedestal corresponds to the ON period of the logic control pulse that sets the oscillation. The start of said logic control signal also initiates a substantial discharge pulse. The latter is electrically coupled with the pedestal drive component, and both impressed upon the SCR gate. The resultant gate drive signal is a rapid rise pulse of sufficient power and magnitude to directly turn on the SCR with negligible internal losses. During the ON period, the discharge section of the circuit is reset for the next gate drive signal. When said logic control pulse ceases, the oscillator hereof turns off, in turn ending the pedestal of the composite gate drive signal.

The gate drive circuitry hereof has substantially less weight than corresponding prior circuits. For example, its transformer complement is at least one-tenth their weight and bulk. It provides sure and effective SCR drive pulses from a circuit arrangement operable at relatively low voltage and low power. Its particularly steep initial pulse rise makes it very efficient for application in high power SCR systems. Its peak current/voltage shape can be readily designed for any available SCR power system. Its design and construction factors are quite flexible for wide application. This results in a longer useful life-time for the SCR's, as well as more precise operation thereof in the system.

DETAILED DESCRIPTION

Figures 1, 2, 3:
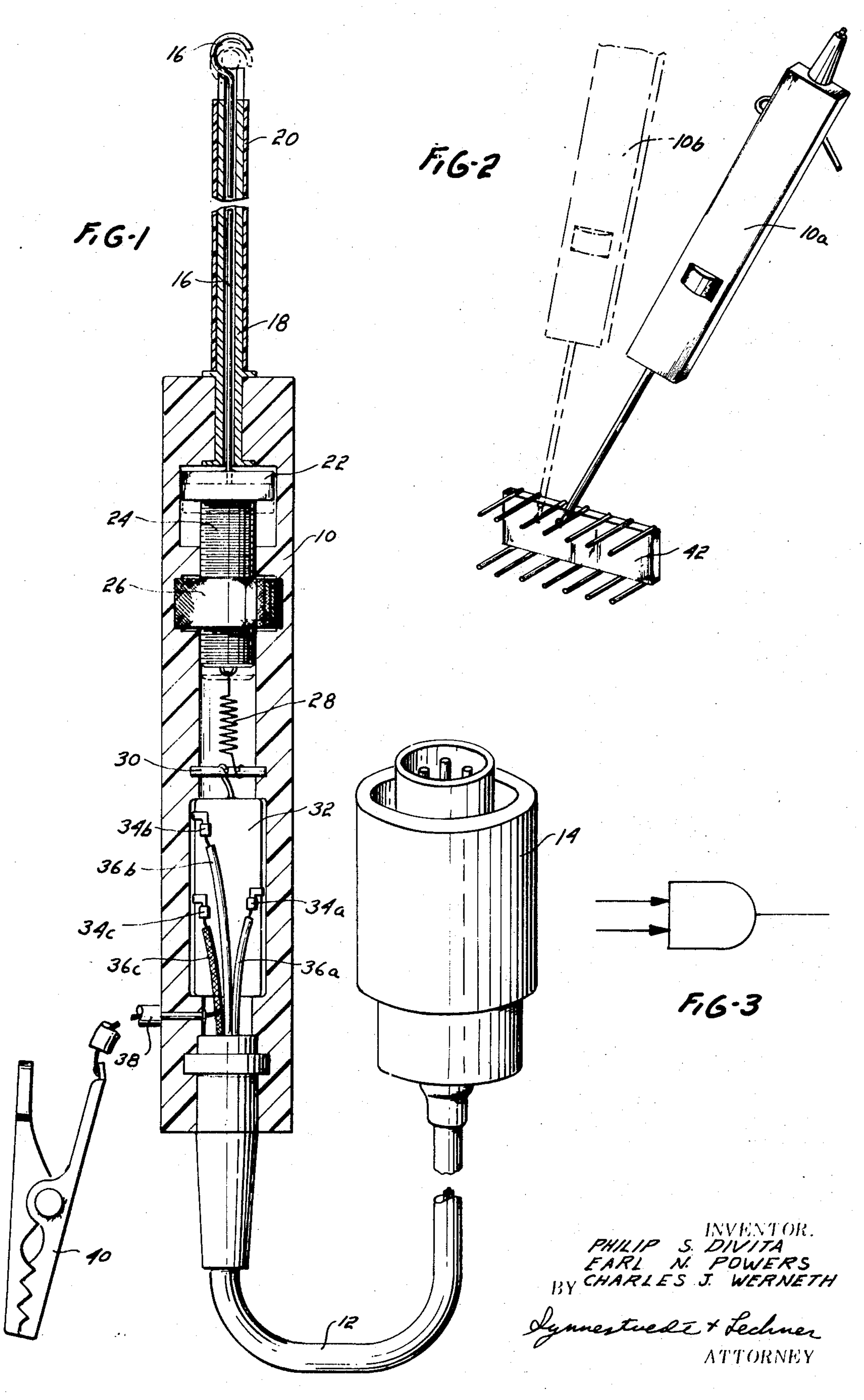
FIG. 1 is a schematic circuit diagram of the exemplary SCR gate drive circuit.
FIG. 2 illustrates the signal wave shapes appearing at the logic control input *a*, and points *b* and *c* of the circuit.
FIG. 3 illustrates the wave shapes of two typical gate drive signals provided by the gate drive circuit hereof.

The controlled rectifier gate drive circuit 10 shown in FIG. 1 is arranged to provide a gate drive pulse for rapidly turning on a power silicon controlled rectifier (12), with optimum rise time and wave shape to insure long SCR life. The controlled rectifier 12 may be a component of a power inverter system, such as described in the aforesaid patent. A suitable positive unidirectional voltage is applied to its anode 11, its cathode 13 being connected to a substantially lower potential point (14) of the inverter circuit during its firing mode. Its gate electrode connects to lead 15, to which the gate drive signal from circuit 10 is applied. A suitable resistor 16 connects across the SCR gate (15) and its cathode (14). The output terminals *d* of gate drive circuit 10 connect to resistor 16, and the SCR input 14, 15.

The gate drive signal is composed essentially of two components: an initial fast rise higher magnitude pulse of short duration provided from network 45, through transformer 46; and the remainder pedestal of lower magnitude and longer duration provided by the modified Royer type oscillator 20 through its transformer 21. Oscillator 20 is a triggered-cross-coupled Royer type. Its frequency is substantially higher than that of the basic inverter system which it gates. Thus a polyphase power inverter with a 400 cycle output may use a frequency for oscillator 20 of the order of 25 kilohertz. Oscillator 20 is turned on when the positive to zero voltage transition of the control logic signal is applied to its input terminal *a*. A typical control input signal is square wave 25 shown at *a* in FIG. 2. Such control signals are provided by conventional TTL 5 volt logic systems.

To be effective herein, the logic system should deliver at least 3 milliamperes in the positive state, at a minimum of 3 volts. Its zero state should be less than +0.4 volts. The selected input wave shape (25) for control point *a* is a negative going pulse with a minimum positive value of 3.0 volts and a "zero level" less than +0.4 volts. The width of pulse 25 is measured while in the zero state. The minimum width of input pulse (25) is preferably 40 microseconds. Other logic voltage levels or characteristics may be used, with corresponding design changes in the circuit 10, as will be understood. For example, if 12 volt logic is used, input resistor 17 is selected to limit the input current to 4 milliamperes. The duration or pulse width T of input signal 25 is preferably the same as the required ON time of the associated SCR (12). The resultant gate drive signal at *d*, see FIG. 3, has same duration (*T*) as signal 25, as will be set forth.

When square wave 25 is applied to input control terminal *a*, the voltage at the base of control transistor 18 drops to zero. Transistor 18 thereupon turns off, causing its collector to go positive as it connects to DC terminal B+, through resistor 19. The resultant positive collector renders the base of transistor 22 positive, thereby turning it ON. Point 23 of oscillator 20 is thereupon brought close to ground potential via lead 24, through ON transistor 22.

The modified Royer oscillator 20 comprises opposed transistors 25, 26. Their emitters connect to circuit point 23; their collectors, to respective terminals 27, 29 of primary transformer winding 30. Center-tap 28 of primary 30 is at local DC supply voltage B+, as 24 volts. A small capacitor 31, 0.33 microfarads herein, connects between center-tap 28 and system ground. The base of each oscillator transistor is cross-connected to the terminals of transformer primary 30: namely, the base (of 25) to its terminal 29, and that of transistor 26 to terminal 27; respectively through RC networks 32 and 33.

During the negative going portion of logic pulse 25 applied to input terminal *a*, control transistor 18 inverts and amplifies the logic level, causing transistors 22 and 47 to also switch. The switching ON of transistor 22 keys oscillator 20 into oscillation, as point 23 is effectively grounded during the "zero" level duration (T) of input signal 25. During such condition the emitters of transistors 25, 26 are grounded and the Royer circuit (20) oscillates at its predetermined frequency, basically determined by its transformer 21. Each time the core of transformer 21 saturates the oscillator changes state. Transformer 21 is step-down, its center-tapped secondary winding 29 supplying the generated pulses to the drive output loop 40.

The output of transformer 21 at secondary winding 29 is full wave, as 12 volts peak-to-peak square waves, to the diodes rectifiers. Diodes 34, 35 fullwave rectify the output, providing a 6 volt unfiltered signal level, in the exemplary circuit. The wave form of said rectified output is illustrated as curve 36 in FIG. 2, and corresponds to the potential at point *b* in circuit 10. A series filter choke 37 removes most of the negative going pulses from the rectifier signal (36), resulting in the pedestal type substantially filtered pulse 38 of duration T at point *c*. The duration of pulse 38 is determined by that of TTL logic pulse 25 impressed upon terminal *a* and control transistor 18. When control pulse 25 returns to its positive phase, after T seconds, transistor 18 directly switches ON, turning OFF transistor 22. Point 23 becomes ungrounded and the output of the oscillator (20) becomes zero. In such state, the pedestal pulse 38 ends, and returns to zero level at T seconds.

The rectified pulse signal 38 is conducted to drive output terminals *d* through diode 41 and current limiting resistor 42, of output circuit loop 40. Diode 41 mixes these pedestal pulses (38) with the sharp leading edge current pulse generated at 45 and inserted into loop 40 through diode 52. The composite gate drive signal results in drive signals such as illustrated at *d* and *d'* in FIG. 3. They can be produced herein with predetermined wave shape, rise time, and magnitude levels as to current and voltage, in accordance with the associated SCR gate drive requirement. Parameters are selected accordingly, as: DC level at B+; frequency of Royer oscillator 20; step-down ratios of transformers 21 and 46; value of limiting resistor 42; components of spike or pulse discharge circuit 45.

The pulse generator 45 comprises pulse transformer 46, the primary winding 47 of which is in series circuit with capacitor 50 to ground. Between discharges, capacitor 50 is charged to the supply voltage B+, through resistor 51 and winding 47, simultaneously resetting the core of the transformer 46. An adequate time interval is thus required between input control pulses (25) to allow such resetting of generator 45. With the invention circuit the logic control signals (25) may be applied at a high rate. A 1,500 per second rate is practical with condenser 50 at 0.22 microfarads, and resistor 51 at 2,200 ohms.

Pulse circuit 45 is thereupon discharged under control of the logic signals (25) as follows: Control transistor 18 is switched OFF when the signal 25 is in its "zero" level phase, in the T periods, as described hereinabove. Its collector is thereby rendered positive, turning ON transistor 49. Capacitor 50 thereupon discharges through primary winding 47 and transistor 49, to ground. A sharp pulse is generated, of duration determined by the L-C constant of winding 47 and capacitor 50.

The secondary winding 48 of pulse transformer 47 is arranged to match the impedance between pulse circuit 45 and the SCR gate input 12, 14. The discharge pulse is fed into output loop 40 by winding 48 and diode 52. In the exemplary circuit, the pulse is approximately 10 microseconds long, and varies in shape according to the SCR gate dynamic characteristics. Its rise time can be readily made less than 200 nanoseconds if the SCR (12) gate leads are kept short to minimize lead inductance. Typical shapes for the spike or peak of the discharge pulses are shown at *s* and *s'* in FIG. 3.

It is noted that the gate drive signals 55 (or 55') are a composite of the generated pulse *s* (or *s'*) and the pedestal or "-back porch" *p* generated by oscillator section 20, see curve 38. The two gate drive signal components *s, p* are coupled into output circuit loop 40 by the respective unidirectional diodes 52, 41 a–s aforesaid. Both signal components are simultaneously initiated by each logic pulse (25).

The resultant gate drive signals 55 (or 55') have the requisite net wave shape, fast rise time, duration, voltage levels, and currents, for most SCR drive requirements. The SCR$^s$ are thereby rapidly fired-up, and at the cyclic timing per the logic control. They thus are operated well within their permissible, internal power loss specifications, resulting in efficient system operation, over a long-life period. Current spikes (*s*) of the produced drive signals 55, can be readily produced herein with a leading edge current pulse of 1.5 amperes or more at a rise of time of 100 nanoseconds, and pulse width of 10 microseconds; and with its pedestal or trailing edge (*p*) at a DC current level of 400 milliamperes or more.

Typical gate drive output signals (55, 55') hereof, with a B+ supply at +28 volts have: their initial pulses (*s, s'*) with short circuit currents of 3 amperes; open circuit voltages at 8 volts; pulse (per se) duration of 10 microseconds; and rise time at less than 200 nanoseconds. Their backporch or pedestal (*p*) has a short circuit current of 350 milliamperes; an open circuit voltage of 4 volts; and duration T as determined by that of the input logic pulses (25).

Transformers 21 and 45 isolate the output circuit loop 40 from the B+ source and ground. This is important for applications with SCR$^s$ that are not ground referenced. The drive circuit 10 comprises relatively small lightweight components, and is readily constructed in pairs on a small "card" as a plug-in module. With optimum gate drive signal wave shape, rapid rise time, and current and voltage magnitudes, these provide a universal SCR gate drive module, as for large power inverter systems. Their ready control by conventional TTL logic pulses is important as well. The SCR$^s$ are efficiently fired ON therewith at precise timing and of desired duration. The SCR$^s$ are turned OFF cyclically, by separate commutation circuitry in well-known manner.

I claim:

1. An electrical system for producing gate drive signals for a controlled rectifier comprising first circuit means for generating pedestal signals each of which are composed of a succession of contiguous substantially equal square waveforms; second circuit means for generating steep signal waveforms each with an initial rise to a magnitude substantially higher than that of said pedestal signals; third circuit means coupled to both said first and second circuit means for jointly initiating the respective generation of their signals periodically in response to correspondingly applied control input pulses, said first circuit means being arranged to generate said successive square waveforms only during the application of the control pulses; and fourth circuit means coupled with said pedestal and steep signals to produce successive composite gate drive signals for the controlled rectifier in correspondence with the control pulses as impressed upon the system.

2. An electrical system as claimed in claim 1, in which said first circuit means includes a gated push-pull type of oscillator that produces the said succession of individual square waveforms in response to periodically control pulses as applied to the system.

3. An electrical system as claimed in claim 2, further including a filter in the output of said oscillator to remove return pulses from the successive square waveforms and provide substantially level pedestal signal outputs.

4. An electrical system as claimed in claim 2, further including an electronic switch connected with said oscillator and responsive to the said control pulses for operating the oscillator to generate its square waveforms only in correspondence with the control pulses.

5. An electrical system for producing gate drive signals for a controlled rectifier comprising first circuit means for generating discrete pedestal signals each of which are composed of a succession of contiguous substantially equal square waveforms; second circuit means coupled to said first circuit means for initiating the generation of its signals in response to corresponding control input pulses; said first circuit means being arranged to generate the successive square waveforms only during the application of control pulses upon the system; and third circuit means coupled with said generated pedestal signals to produce predetermined gate drive signals for the controlled rectifier each of duration equal to that of the control pulses as impressed upon the system.

6. An electrical system as claimed in claim 5, in which said first circuit means includes a gated push-pull type of oscillator that produces the said succession of individual square waveforms in response to successive control pulses as applied to the system.

7. An electrical system as claimed in claim 6, further including a filter in said third circuit means that removes return strokes from the successive square waveforms and provides substantially level pedestal signal outputs.

8. An electrical system as claimed in claim 7, further including an electronic switch connected with said oscillator and responsive to the said control pulses for operating the oscillator to generate its square waveforms only during the application of the control pulses.

* * * * *